(12) United States Patent
Stefanini

(10) Patent No.: US 12,113,258 B2
(45) Date of Patent: Oct. 8, 2024

(54) POWER SWITCH COMPRISING A SWITCHING CIRCUIT SERIALLY CONNECTED BETWEEN INPUT AND OUTPUT LINES EACH HAVING PARALLEL BRANCHES THEREIN

(71) Applicant: AIRMEMS, Limoges (FR)

(72) Inventor: Romain Stefanini, Limoges (FR)

(73) Assignee: AIRMEMS, Limoges (FR)

( * ) Notice: Subject to any disclaimer, the term of this patent is extended or adjusted under 35 U.S.C. 154(b) by 338 days.

(21) Appl. No.: 17/624,219

(22) PCT Filed: Jun. 8, 2020

(86) PCT No.: PCT/IB2020/055373
§ 371 (c)(1),
(2) Date: Dec. 30, 2021

(87) PCT Pub. No.: WO2021/001708
PCT Pub. Date: Jan. 7, 2021

(65) Prior Publication Data
US 2022/0352611 A1    Nov. 3, 2022

(30) Foreign Application Priority Data
Jul. 3, 2019    (FR) ...................................... 1907429

(51) Int. Cl.
*H01P 1/10*    (2006.01)
*H01H 1/00*    (2006.01)
(Continued)

(52) U.S. Cl.
CPC ............. *H01P 1/10* (2013.01); *H01H 1/0036* (2013.01); *H01H 59/0009* (2013.01);
(Continued)

(58) Field of Classification Search
CPC ..................................... H01P 1/10; H01P 1/15
(Continued)

(56) References Cited

U.S. PATENT DOCUMENTS

| | | |
|---|---|---|
| 5,662,816 A | 9/1997 | Andry |
| 2003/0030519 A1* | 2/2003 | Wyeth et al. ........ H01Q 15/002 |
| | | 335/78 |
| 2005/0245209 A1 | 11/2005 | Schlesinger |
| 2016/0079019 A1 | 3/2016 | Borodulin |

(Continued)

FOREIGN PATENT DOCUMENTS

| | | |
|---|---|---|
| JP | 2009055344 A | 3/2009 |
| JP | 2017530628 A | 10/2017 |

(Continued)

OTHER PUBLICATIONS

Office Action issued in Indian Patent Application No. 202117060712 dated Aug. 29, 2023.
Search Report and Written Opinion of FR Application No. 1907429 dated Apr. 14, 2020, 9 pages.
(Continued)

*Primary Examiner* — Benny T Lee
(74) *Attorney, Agent, or Firm* — NIXON & VANDERHYE

(57) ABSTRACT

A power switch including input and output lines of characteristic impedance Z0, and a switching area connected serially between the input and output lines, the switching area being formed by N (integer≥2) parallel conducting branches and i belonging to {1, . . . , N}, each conducting branch having, from input to output lines of the switch, an input line portion with characteristic impedance Zbei in series with a switching circuit in series with an output line portion with characteristic impedance Zbsi, the switching circuit configured, in a first state, to block passage of a signal between the input and output line portions of the conducting
(Continued)

branch and, in a second state, to transmit a signal between the input line portion and the output line portion of the conducting branch with a maximum reflection coefficient of 0.316, each of the characteristic impedances Zbei and Zbsi ranging from 0.75*N*Z0 to 1.35*N*Z0.

16 Claims, 3 Drawing Sheets

(51) Int. Cl.
    *H01H 59/00*     (2006.01)
    *H01P 3/08*     (2006.01)
    *H03H 7/38*     (2006.01)
    *H03H 7/00*     (2006.01)

(52) U.S. Cl.
    CPC ............... *H01P 3/081* (2013.01); *H03H 7/38* (2013.01); *H03H 2007/006* (2013.01)

(58) Field of Classification Search
    USPC .......................................................... 333/101
    See application file for complete search history.

(56) References Cited

U.S. PATENT DOCUMENTS

| | | | |
|---|---|---|---|
| 2016/0112013 A1 | | 4/2016 | Mao et al. |
| 2019/0020088 A1* | | 1/2019 | Huettner et al. ..... H03K 17/693 |
| 2019/0068167 A1 | | 2/2019 | Bacon et al. |
| 2019/0109377 A1 | | 4/2019 | Watanabe |

FOREIGN PATENT DOCUMENTS

| | | |
|---|---|---|
| WO | 2016/062956 | 4/2016 |
| WO | 2017187473 A1 | 11/2017 |

OTHER PUBLICATIONS

International Search Report for PCT/IB2020/055373 dated Sep. 25, 2020, 6 pages.
Written Opinion of the ISA for PCT/IB2020/055373 dated Sep. 25, 2020, 6 pages.
Office Action, issued in Japanese Patent Application No. 2021-577232 dated Apr. 5, 2024.
Office Action, issued in European Patent Application No. 20737277.2 dated May 3, 2024.

* cited by examiner

POWER SWITCH COMPRISING A SWITCHING CIRCUIT SERIALLY CONNECTED BETWEEN INPUT AND OUTPUT LINES EACH HAVING PARALLEL BRANCHES THEREIN

CROSS-REFERENCE TO RELATED APPLICATIONS

This application is the U.S. national phase of International Application No. PCT/IB2020/055373 filed Jun. 8, 2020 which designated the U.S. and claims priority to French Patent Application No. 1907429 filed Jul. 3, 2019, the entire contents of each of which are hereby incorporated by reference.

BACKGROUND OF THE INVENTION

Field of the Invention

The present invention relates to the field of radio frequency electronics, and in particular to a high frequency large bandwidth power switch and to a device incorporating power switches capable of operating over a wide frequency band.

Description of the Related Art

The ever-increasing demand for digital data is leading to increased traffic, requiring electronic systems to improve their performance. 5G mobile networks, for example, will need to carry 100 times more data and connect 100 times more devices than previous telecommunication architectures. These challenges require the integration of compact electronic components capable of transmitting high power levels both in the 0.8-6 GHz band and at millimetre frequencies (28-40 GHz).

Electromechanical switches (relays) or ferrite-based switches can exceed 50 W up to 40 GHz but are still very large.

Much more compact, semiconductor switches easily exceed millimetre wavelengths but their very satisfactory power withstanding at low frequencies (>100 W at 2 GHz) decreases significantly at millimetre wavelengths where the junction temperature becomes too high.

Similarly, MEMS (Micro-Electro-Mechanical Systems) switches are very small and easily reach 40 GHz, but their power withstanding remains limited by the temperature, which increases with frequency at their mechanical contact.

These technological limitations can be overcome by arranging several transistors, diodes or MEMS membranes in parallel on the same switching device. This technique remains compact and allows the currents to be distributed over each element, limiting the heating on each junction or each mechanical contact respectively. However, this technique has limitations because:

this technique generates significant parasitic capacitances which considerably reduce the frequency bandwidth of the switch, this technique does not allow for the uniform distribution of currents flowing out of the conductors when the signal wavelength becomes close to the size of the device.

SUMMARY OF THE INVENTION

In the context of the present application, a switch is used to route signals: it must guarantee the routing of the signal by limiting losses/attenuation during this routing.

The switch has only two states: ON and OFF.

In the on-state, the signal is passed from the input to the output, with a maximum output transmission parameter (between 0 and −3 dB) and a minimum input reflection parameter (−∞ and −15 dB) over its operating frequency band. In the off state, the signal is isolated between input and output and is reflected, with a minimum output transmission parameter (between −∞ and −15 dB) and a maximum input reflection parameter (between 0 and −3 dB) over its operating frequency band. In this state, the switch has a very high impedance over its frequency band (>500 Ohms). This impedance is very often implemented by an isolation capacitor.

The present application does not concern attenuators, such as the one described in US2019/0068167A1. Indeed, a variable attenuator is used to attenuate signals, and is usually composed of several switches.

In the context of the present invention, it is important that the reflection parameter is maximum in the off state: this ensures that the signal can be routed on more complex circuits while limiting losses. The present invention is therefore limited to switches.

In the context of the present invention, a "power switch" is defined as a switch that can operate with powers greater than 30 dBm (1 W) in both the on and off states.

The invention aims at solving the problems of the prior art by proposing a power switch comprising an input line of characteristic impedance $Z_0$, an output line of characteristic impedance $Z_0$, and a switching zone connected in series between the input line and the output line, the switching zone being constituted by N conducting branches $b_i$ in parallel, with N an integer greater than or equal to 2 and i belonging to $\{1, \ldots, N\}$, each conducting branch $b_i$ having, from the input line to the output line of the switch, an input line portion of characteristic impedance $Z_{bei}$ in series with a switching circuit $c_i$ in series with an output line portion of characteristic impedance $Z_{bsi}$, characterized in that the switching circuit $c_i$ is configured, in a first state, to block the passage of a signal between the input line portion and the output line portion of the conducting branch $b_i$ and, in a second state, to transmit a signal between the input line portion and the output line portion of the conducting branch $b_i$ with a reflection coefficient less than or equal to 0.316, each of the characteristic impedances $Z_{bei}$ and $Z_{bsi}$ being comprised between $0.75*N*Z_0$ and $1.35*N*Z_0$.

See that FIG. 1 discloses 4 branches $b_i$, namely output branches $b_{s1}$, $b_{s2}$, $b_{s3}$, and $b_{s4}$ as well as corresponding output characteristic impedances $Z_{bs1}$, $Z_{bs2}$, $Z_{bs3}$, and $Z_{bs4}$ as well as input branches $b_{e1}$, $b_{e2}$, $b_{e3}$, and $b_{e4}$ as well as corresponding input characteristic impedances $Z_{be1}$, $Z_{be2}$, $Z_{be3}$, and $Z_{be4}$. Note that the characteristic impedance $Z_0$ is shown in the drawings with a slash through the "0". Also shown are switching circuits $c_1$, $c_2$, $c_3$, and $c_4$ (for $c_i$, N=4) having characteristic impedances $Z_{c1}$, $Z_{c2}$, $Z_{c3}$, and $Z_{c4}$.

The switching circuit $c_i$ is connected in series between the input line portion and the output line portion.

This creates on each conducting branch $b_i$ a characteristic impedance that is ideally N times the characteristic impedance of the input line and of the output line, causing the current to divide equally over a wide frequency band across all the switching circuits to enable the power switch to provide power withstanding at very high frequencies.

This configuration also limits the parasitic effects between the switching circuits to have a power switch capacitance corresponding to the sum of the isolation capacitances of each switching circuit.

In one embodiment, each switching circuit ci of the conducting branch bi has a characteristic impedance Zci between 0.5*N*Z0 and 1.5*N*Z0 allowing a very low reflection coefficient.

In one embodiment, each switching circuit ci has an electrical length of less than one tenth of the wavelength guided by the switch.

The very short electrical length of the switching circuit compared to the wavelength guided by the switch also allows a very low reflection coefficient.

According to one embodiment, each switching circuit is constituted by one of a single switch, a set of switches arranged in parallel, a set of switches arranged in series, a set of switches arranged in shunt to ground, a combination of the previous types. Each switching circuit may therefore be of the following types: a single switch, a set of switches arranged in parallel, a set of switches arranged in series, a set of switches arranged in shunt to ground, or a combination of the preceding types.

In one embodiment, the switching circuits are identical on each of the conducting branches bi. "Identical" means that the switching circuits are all of the same type on each of the conducting branches, for example, each of the branches has a single switch, or each of the branches has a set of switches arranged in parallel, or each of the branches has a set of switches arranged in series, or each of the branches has a set of switches arranged in shunt to ground.

According to one embodiment, the switching circuits are different on at least two conducting branches bi. By "different", it is meant that the switching circuits are of different types on at least two conducting branches.

According to one embodiment, each switch is one of a microelectromechanical switch (MEMS), a phase change material, a diode, a transistor, a relay, a ferroelectric switch, a ferromagnetic switch, an electromechanical switch, a waveguide switch and a ferrite-based switch.

According to one embodiment, the power switch further comprises a switching circuit control means configured to control one of the opening and closing of the switching circuits, either simultaneously or sequentially.

The control means can thus be, for example, a voltage source controlling the opening or closing of the switching circuits, the voltage source being external or internal to the power switch.

In one embodiment, each of the input line, the output line and the input line portion and the output line portion of each branch bi is constituted by one of a 3D waveguide, a coplanar line, a microstrip line, a triplate line and a coaxial guide.

The branches bi within a power switch may be of the same or different lengths, without departing from the scope of the present invention.

The invention also relates to a power switching device characterized in that it comprises an input line of characteristic impedance Z1, an output line of characteristic impedance Z1, and a switching zone connected in series between the input line and the output line, the switching zone being constituted by N conducting branches Bi in parallel, with N an integer greater than or equal to 2 and i belonging to {1, ... N}, each conducting branch Bi having, from the input line to the output line of the switching device, an input line portion of characteristic impedance ZAei in series with a power switch Ci as defined above in series with an output line portion of characteristic impedance ZAsi, the power switch Ci being configured, in a first open state, to block the passage of a signal between the input line portion and the output line portion of the conducting branch Bi and, in a second state, to transmit a signal between the input line portion and the output line portion of the conducting branch Bi with a reflection coefficient less than or equal to 0.316, each of the characteristic impedances ZAei and ZAsi being between 0.75*N*Z1 and 1.35*N*Z1.

This topology can be used to form a single pole single throw (SPST) switch, a single pole double throw (SPDT) switch, a single pole N-throws (SPNT) switch, a circuit, e.g. a filter, a phase shifter, an impedance adapter, a variable attenuator.

A BRIEF DESCRIPTION OF THE DRAWINGS

In order to better illustrate the object of the present invention, embodiments will now be described hereafter, by way of illustration and in a non-limiting manner, in connection with the appended drawings.

DETAIL DESCRIPTION OF THE PREFERRED EMBODIMENTS

Figure 1:
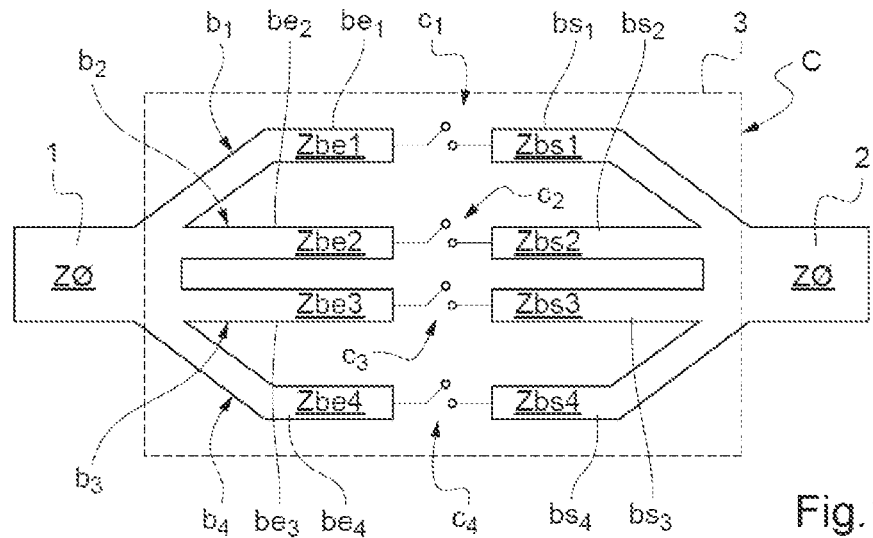
FIG. 1 is a schematic view of a power switch according to the present invention.

Referring to FIG. 1, it can be seen that a power switch C according to the present invention is shown.

The power switch C comprises an input line 1, an output line 2, and a switching zone 3 in series between the input line 1 and the output line 2.

In the example shown, the switching zone 3 consists of four conducting branches, respectively b1, b2, b3 and b4. However, the invention is not limited in this respect and the switching zone may have any number of conducting branches. In the following, in order to give an example, a number of conducting branches equal to four will be given for illustration purposes only.

Each conducting branch comprises an input line portion, respectively be1, be2, be3 and be4, an output line portion, respectively bs1, bs2, bs3 and bs4, and a switching circuit, respectively c1, c2, c3 and c4, between the input line portion and the respective output line portion, represented here by a switch arranged in series.

The switching circuits may be all the same or different, and may be selected from microelectromechanical switch (MEMS), phase change material, diode, transistor, relay, ferroelectric switch and ferromagnetic switch, electromechanical switch, waveguide switch and ferrite-based switch, the invention not being limited in this respect.

According to the invention, the characteristic impedance is Z0 at the input line 1, the characteristic impedance is Z0 at the output line 2, the characteristic impedance is Zbei at the input line portion bei of each conducting branch bi (i belonging to the set {1, ..., 4} in the case of FIG. 1), the characteristic impedance is Zbsi at the output line portion bsi of each conducting branch bi (i belonging to the set $\{1, \ldots, 4\}$ in the case of FIG. 1) verify the following relations with N=4:

$0.75*N*Z0 \leq Zbei \leq 1.35*N*Z0$ $0.75*N*Z0 \leq Zbsi \leq 1.35*N*Z0$ According to an embodiment, the characteristic impedances Zbei, i belonging to the set $\{1, \ldots, 4\}$ in the case of FIG. 1, of each of the input line portions bei are equal.

According to an embodiment, the characteristic impedances Zbsi, i belonging to the set $\{1, \ldots, 4\}$ in the case of FIG. 1, of each of the output line portions bsi are equal.

According to another embodiment, the characteristic impedances Zbei, i belonging to the set $\{1, \ldots, 4\}$ in the case of FIG. 1, of each of the input line portions bei and the characteristic impedances Zbsi, i belonging to the set $\{1, \ldots, 4\}$ in the case of FIG. 1, of each of the output line portions bsi are equal. The characteristic impedance Zci of each switching circuit ci, i belonging to the set $\{1, \ldots, 4\}$ in the case of FIG. 1, is preferably between $0.5*Z0$ and $1.5*Z0$.

According to yet another embodiment, when the characteristic impedances Zbei, i belonging to the set $\{1, \ldots, 4\}$ in the case of FIG. 1, of each of the input line portions bei and the characteristic impedances Zbsi, i belonging to the set $\{1, \ldots, 4\}$ in the case of FIG. 1, of each of the output line portions bsi are equal, the characteristic impedances Zci of each of the switching circuits ci are equal to the A impedances Zbei and Zbsi, i.e. for any and all i and for any and all j belonging to the set $\{\{1, \ldots, 4\}, \{1, \ldots, 4\}, i \neq j$ in the case of FIG. 1$\}$, Zbei=Zbej=Zci=Zcj=Zbsi=Zbsj.

According to yet another embodiment, when the characteristic impedances Zbei, i belonging to the set $\{1, \ldots, 4\}$ in the case of FIG. 1, of each of the input line portions bei and the characteristic impedances Zbsi, i belonging to the set $\{1, \ldots, 4\}$ in the case of FIG. 1, of each of the output line portions bsi are equal, each switching circuit ci, i belonging to the set $\{1, \ldots, 4\}$ in the case of FIG. 1, has an electrical length of less than one tenth of the wavelength guided by the switch.

With all the embodiments, a relatively uniform high-frequency current distribution is achieved in each of the conducting branches bi, allowing the power switch C to operate at high frequencies and high power, with minimal parasitic capacitances between each of the conducting branches bi.

Figure 2A:
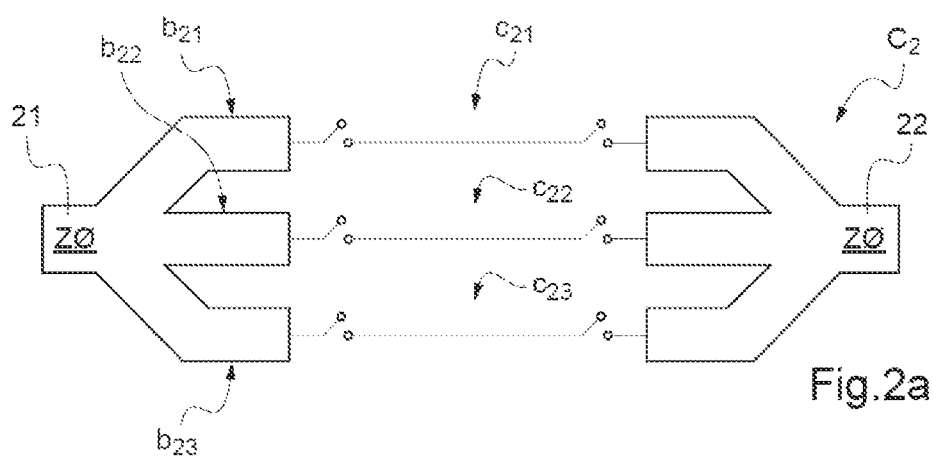
FIG. 2a is a schematic view of a power switch according to FIG. 1 with switching circuits according to a first variant of the invention.

According to a first variant of the invention shown in FIG. 2a, in which a switch C2 is shown with three conducting branches, respectively b21, b22 and b23, between an input line 21 and an output line 22, each switching circuit, respectively c21, c22 and c23, consists of two switches in series, which promotes the voltage withstanding of the switch in its insulating state.

Figure 2B:
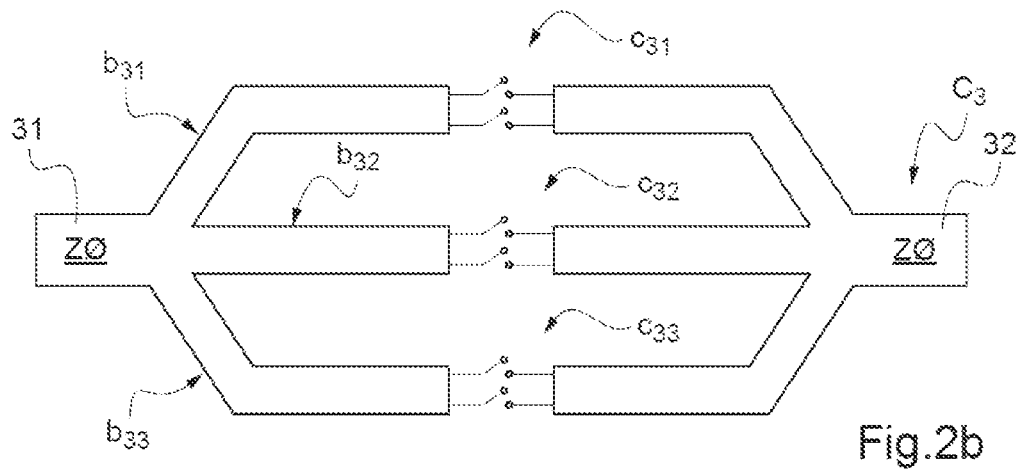
FIG. 2b is a schematic view of a power switch according to FIG. 1 with switching circuits according to a second variant of the invention.

According to a second variant of the invention shown in FIG. 2b, in which a switch C3 is shown with three conducting branches, respectively b31, b32 and b33, between an input line 31 and an output line 32, each switching circuit, respectively c31, c32 and c33, consists of two switches in parallel favouring the power withstanding in its conducting state.

Figure 2C:
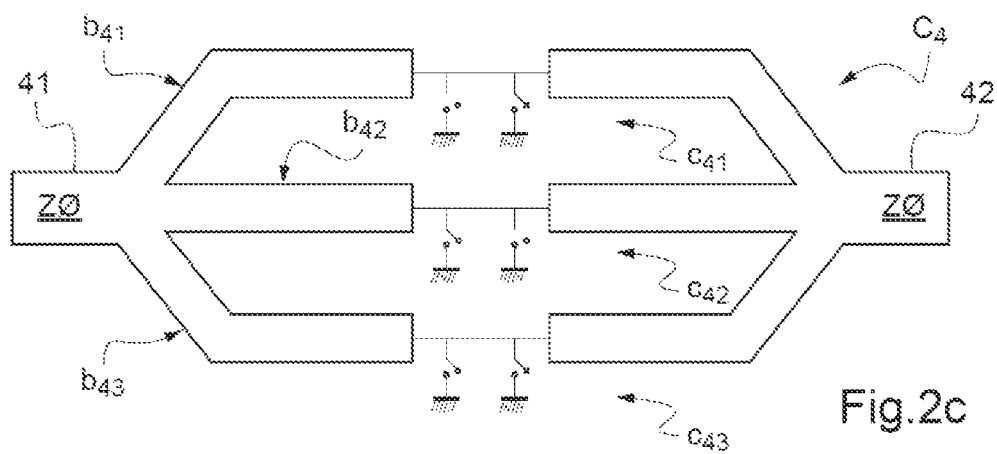
[FIG. 2c] is a schematic view of a power switch according to FIG. 1 with switching circuits according to a third variant of the invention.

According to a third variant of the invention shown in FIG. 2c, in which a switch C4 is shown with three conducting branches, respectively b41, b42 and b43, between an input line 41 and an output line 42, each switching circuit, respectively c41, c42 and c43, is constituted by two switches in parallel with the ground promoting the insulation level of the switch.

Figure 2D:
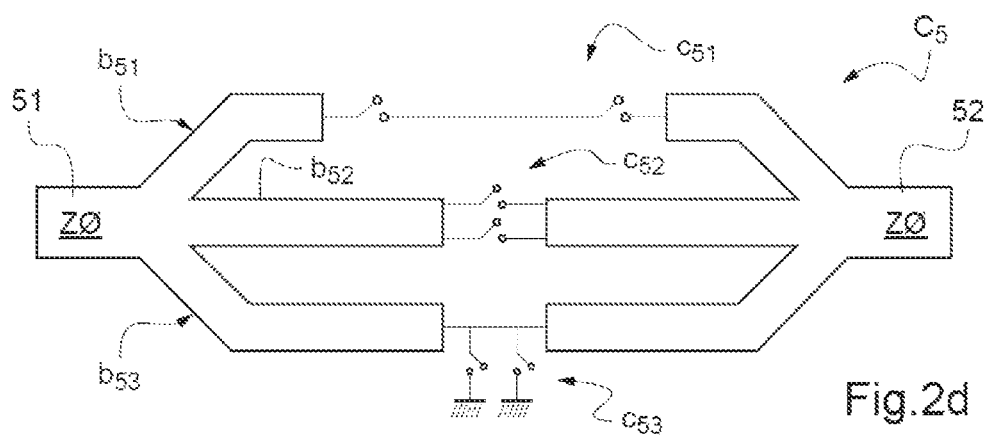
FIG. 2d is a schematic view of a power switch according to FIG. 1 with switching circuits according to a fourth variant of the invention.

According to a fourth variant of the invention shown in FIG. 2d, in which a switch C5 is shown with three conducting branches, respectively b51, b52 and b53, between an input line 51 and an output line 52, each switching circuit, respectively c51, c52 and c53, is constituted respectively by two switches in series, two switches in parallel and two switches in parallel with the ground, improving the reliability in hot switching by a well-defined consecutive activation of the elements, hot switching being the switching operation carried out in presence of power.

These different configurations allow the current to divide equally over a wide frequency band across all the switching circuits to enable the power switch to provide power withstanding at very high frequencies, provided that the conditions above are met, namely a characteristic impedance of each input line portion and characteristic impedance of each output line portion of each conducting branch between $0.75*N*Z0$ and $1.35*N*Z0$, where Z0 represents the characteristic impedance of the input line of the switch and of the output line of the switch, and each switching circuit is configured, in a first state, to block the passage of a signal between the input line portion and the output line portion of the conducting branch bi and, in a second state, to transmit a signal between the input line portion and the output line portion of the conducting branch with a reflection coefficient of 0.316 or less.

Depending on these different configurations, each switching circuit can either have a characteristic impedance between $0.5*Z0$ and $1.5*Z0$, or have an electrical length of less than one tenth of the wavelength guided by the switch.

It is understood that each of the input line and the output line are understood to be in the direction of current flow in the switch, and some switches according to the invention can be used in both directions of current flow in them.

In each conducting branch bi in the switching area, the branches (input portion and/or output portion) can have any length, identical or different from each other.

In case the switches are MEMS, the conducting branches can be integrated into the MEMS, following the configuration described in PCT International Application WO2016/062956, the contents of which are incorporated by reference to the present description.

Figure 3:
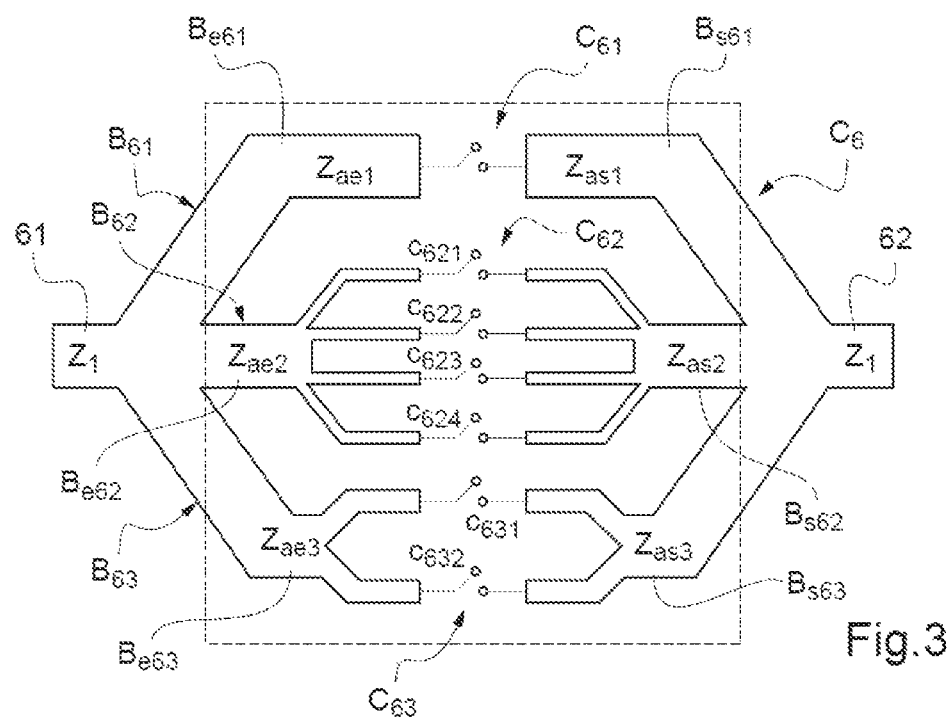
FIG. 3 is a schematic view of a power switching device according to the present invention.

In FIG. 3, a switching device C6 is shown, consisting in the non-limiting example shown, of three conducting branches, respectively B61, B62, B63, in series between an input line 61 and an output line 62.

On the first conducting branch B61, the switching circuit C61 consists of a single switch.

On the second conducting branch B62, the switching circuit C62 consists of a switch similar to that shown in FIG. 1, with four conducting sub-branches, each carrying a switching circuit, respectively c621, c622, c623 and c624.

On the third conducting branch B63, the switching circuit C63 consists of a switch similar to that shown in FIG. 1, with two conducting sub-branches, each carrying a switching circuit, respectively c631, c632.

Each of the switches C62 and C63 of FIG. 3 inherently satisfies the conditions of the switch in FIG. 1, namely, taking Za2 as the characteristic impedance of the input line Be62 and output line Bs62, each characteristic impedance of the conducting branches of the switch C62, of input line portion Zae2 and output line portion Zas2 of the switch C62, are between $0.75*N*Za2$ and $1.35*N*Za2$, and the switches c621, c622, c623 and c624 are configured to have a reflection coefficient less than or equal to 0.316 between each respective input line portion and output line portion.

Similarly for branch B63, taking Za3 as the characteristic impedance of the input line Be63 and output line Bs63, each characteristic impedance of the conducting branches of the switch B63, of input line portion Zae3 and output line portion Zas3, are between 0.75*N*Za3 and 1.35*N*Za3 and the switches c631, c632, are configured to have a reflection coefficient of 0.316 or less between each respective input line portion and output line portion.

The input line Be61 and output line Bs61 each have respectively a characteristic impedance of input line portion Zae1 and output line portion Zas1, as shown in FIG. 3.

Overall, taking Z1 as the characteristic impedance of the input line and output line of the switching device C6, there is also each characteristic impedance of input line portion (Zae1, Zae2, Zae3) and output line portion (Zas1, Zas2, Zas3) comprised between 0.75*N*Z1 and 1.35*N*Z1, and the switches C61, C62 and C63 are configured to have a reflection coefficient less than or equal to 0.316 between each respective input line portion and output line portion.

The present invention therefore allows a great deal of design freedom for an individual switch, and also for switching devices comprising several individual switches according to the present invention, in order to adapt the design to the maximum powers and frequencies at which the switch or device incorporating switches can operate.

The invention claimed is:

1. A power switch comprising:
an input line of characteristic impedance Z0,
an output line of characteristic impedance Z0, and
a switching zone connected in series between the input line and the output line,
the switching zone being constituted by N conducting branches bi in parallel, with N being an integer greater than or equal to 2 and i belonging to {1, . . . N},
each conducting branch bi having, from the input line to the output line of the switch, an input line portion of characteristic impedance Zbei in series with a switching circuit ci in series with an output line portion of characteristic impedance Zbsi,
wherein the switching circuit ci is configured, in a first state, to block the passage of a signal between the input line portion and the output line portion of the conducting branch bi and, in a second state, to transmit a signal between the input line portion and the output line portion of the conducting branch bi with a reflection coefficient less than or equal to 0.316, and
wherein each of the input line portion of characteristic impedance Zbei and the output line portion of characteristic impedance Zbsi are between 0.75*N*Z0 and 1.35*N*Z0.

2. The power switch according to claim 1, wherein each switching circuit ci of the conducting branch bi has a characteristic impedance Zci between 0.5*N*Z0 and 1.5*N*Z0.

3. The power switch according to claim 2, wherein each switching circuit ci has an electrical length of less than one tenth of the wavelength guided by the switch.

4. The power switch according to claim 2, wherein the switching circuits are identical in type on each of the conducting branches bi.

5. The power switch according to claim 2, wherein the switching circuits are different in type on at least two conducting branches bi.

6. The power switch according to claim 1, wherein each switching circuit ci has an electrical length of less than one tenth of the wavelength guided by the switch.

7. The power switch according to claim 6, wherein the switching circuits are identical in type on each of the conducting branches bi.

8. The power switch according to claim 6, wherein the switching circuits are different in type on at least two conducting branches bi.

9. The power switch according to claim 1, wherein each of the input line, the output line and the input line portion and the output line portion of each branch bi is constituted by one of a 3D waveguide, a coplanar line, a microstrip line, a triplate line and a coaxial guide.

10. The power switch according to claim 1, wherein the switching circuits are identical in type on each of the conducting branches bi.

11. The power switch according to claim 1, wherein the switching circuits are different in type on at least two conducting branches bi.

12. The power switch according to claim 6, wherein each switching circuit is a configuration constituted by one of a single switch, a set of switches arranged in parallel, a set of switches arranged in series, a set of switches arranged in shunt to ground, and a combination of the preceding configurations.

13. The power switch according to claim 12, wherein each switch is one of a microelectromechanical switch (MEMS), a phase change material, a diode, a transistor, a relay, a ferroelectric switch, a ferromagnetic switch, an electromechanical switch, a waveguide switch and a ferrite-based switch.

14. The power switch according to claim 12, wherein the switching circuits are identical in type on each of the conducting branches bi.

15. The power switch according to claim 12, wherein the switching circuits are different in type on at least two conducting branches bi.

16. A power switching device comprising a further input line of characteristic impedance Z1, a further output line of characteristic impedance Z1, and a further switching zone connected in series between the further input line and the further output line, the further switching zone being constituted by N further conducting branches Bi in parallel, with N being an integer greater than or equal to 2 and i belonging to {1, . . . N}, each further conducting branch Bi having, from the further input line to the further output line of the switching device, a further input line portion of characteristic impedance ZAei in series with the power switch (Ci) according to claim 1 in series with a further output line portion of characteristic impedance ZAsi, wherein each of the further input line portion of characteristic impedance ZAei and the further output line portion of characteristic impedance ZAsi are between 0.75*N*Z1 and 1.35*N*Z1.

* * * * *